(12) United States Patent
Fan et al.

(10) Patent No.: US 10,342,158 B2
(45) Date of Patent: Jul. 2, 2019

(54) LIQUID COOLING DEVICE AND ELECTRONIC DEVICE APPLYING THE LIQUID COOLING DEVICE

(71) Applicant: CELESTICA TECHNOLOGY CONSULTANCY (SHANGHAI) CO. LTD., Shanghai (CN)

(72) Inventors: Yaoyin Fan, Shanghai (CN); Peng Wei, Shanghai (CN); Shihui Hong, Shanghai (CN); Wei Huang, Shanghai (CN)

(73) Assignee: CELESTICA TECHNOLOGY CONSULTANCY (SHANGHAI) CO. LTD., Pudong District, Shanghai (CN)

( * ) Notice: Subject to any disclaimer, the term of this patent is extended or adjusted under 35 U.S.C. 154(b) by 0 days.

(21) Appl. No.: 15/803,727

(22) Filed: Nov. 3, 2017

(65) Prior Publication Data

US 2018/0338389 A1  Nov. 22, 2018

(30) Foreign Application Priority Data

May 17, 2017 (CN) .......................... 2017 1 0348320

(51) Int. Cl.
*H05K 7/20* (2006.01)
*H05K 1/02* (2006.01)

(52) U.S. Cl.
CPC ....... *H05K 7/20254* (2013.01); *H05K 1/0201* (2013.01); *H05K 7/20272* (2013.01); *H05K 7/20281* (2013.01)

(58) Field of Classification Search
CPC ........... H05K 7/20254; H05K 7/20272; H05K 1/0201; H05K 7/20281
USPC ...... 361/711, 699, 702, 679.53, 715, 679.54, 361/689, 696, 698, 679.48, 695, 679.46, 361/688; 165/166, 80.2, 80.5, 104.33, 165/80.4, 80.3; 257/714, 704, 707, 257/E23.098; 174/15.1, 547; 312/236
See application file for complete search history.

(56) References Cited

U.S. PATENT DOCUMENTS 5,285,347 A * 2/1994 Fox ........................... G06F 1/20
165/80.3
5,825,635 A * 10/1998 Mukoyama .......... H05K 1/0271
361/826

(Continued)

*Primary Examiner* — Mandeep S Buttar
(74) *Attorney, Agent, or Firm* — Global IP Services; Tianhua Gu

(57) ABSTRACT

A liquid cooling device, which is used for performing heat dissipation to switching chips and optical modules in the electronic device, and comprises: a first cooling plate attached to the switching chip and used for performing heat dissipation to the switching chip; a second cooling plate attached to the optical module and used for performing heat dissipation to the optical module; an air-liquid heat exchanger used for containing cooling liquid and performing cooling to backflow cooling liquid through cooling air; a transmission pipe used for sequentially transmitting the cooling liquid flowing out from the air-liquid heat exchanger to the first cooling plate and the second cooling plate, which then flows back to the air-liquid heat exchanger; and a power device used for controlling the cooling liquid in the transmission pipe to be sequentially transmitted to the first cooling plate and the second plate and then flow back.

1 Claim, 3 Drawing Sheets

(56) References Cited

U.S. PATENT DOCUMENTS

| | | | | |
|---|---|---|---|---|
| 6,826,923 | B2* | 12/2004 | Nakano | F25B 5/04 165/104.33 |
| 9,473,422 | B1* | 10/2016 | Armistead, III | H04L 49/15 |
| 2002/0117291 | A1* | 8/2002 | Cheon | G06F 1/20 165/80.4 |
| 2004/0250992 | A1* | 12/2004 | Aoki | H05K 7/20727 165/80.3 |
| 2005/0244280 | A1* | 11/2005 | Malone | F04B 19/006 417/286 |
| 2006/0002086 | A1* | 1/2006 | Teneketges | H01L 23/473 361/699 |
| 2007/0284094 | A1* | 12/2007 | Pawlak | G06F 1/20 165/122 |
| 2016/0006088 | A1* | 1/2016 | Boetcher | H01M 10/63 165/80.2 |
| 2016/0183407 | A1* | 6/2016 | Katsumata | H05K 7/20254 361/699 |

* cited by examiner

LIQUID COOLING DEVICE AND ELECTRONIC DEVICE APPLYING THE LIQUID COOLING DEVICE

BACKGROUND OF THE PRESENT INVENTION

Field of Invention

The present invention relates to an electronic device, in particular relates to a liquid cooling device and an electronic device applying the liquid cooling device.

Description of Related Arts

Usually, a high-power switch consists of devices such as optical modules, a switching chip, a central processing unit, a power supply, a fan and a control board. With the capacity expansion of a data machine room, the power density of the switch is caused to be continuously increased, and the heat dissipation situation of the optical modules and the switching chip in switch design is the most severe.

In order to guarantee the optical modules to reliably work for a long time, the highest operating temperature thereof needs to be controlled within 70° C. The maximum heating value of the current used optical module 100G QSFP28 is 5 W, but the maximum heating value of the next-generated optical module 400G QSFP-DD which is to be put into operation will directly increase by 60% and reach 8 W. In addition that the heating value is increasingly high, in actual application, the optical modules need to be inserted into a case for use, consequently the optical modules cannot be directly cooled and stacked optical modules increase the difficulty in heat dissipation design. In addition to the optical modules, the power consumption of the switching chip increases with the increasing of the requirement on switching capacity. The maximum heating value of the current used switching chip Tomahawk1.0 is 175 W, but the maximum heating value of the next-generation switching chip Tomahawk2.0 will increase by 74% and highly reach 305 W. In addition that the switching chip needs to be guaranteed to operate normally under a situation of high power consumption, special protection measures further need to be taken on an FSC aiming at the switching chip to prevent overheating. A set upper limit of common overheating protection temperature is 105° C. For the above-mentioned reasons, the traditional air cooling method has been insufficient to solve the problem of heat dissipation of the next-generation high-power optical modules and switching chip, and a new cooling method needs to be found.

Besides, the particularity of the heat dissipation design of the switch further includes the requirement on noise, the requirement that high ambient temperature is supported in a short time, the two-air-direction requirement that the front-in rear-out air supply method and the rear-in front-out air supply method are simultaneously supported, and the redundancy design of the fan and the power supply. With respect to the rear-in front-out air supply method at high ambient temperature, upstream air is preheated by devices such as the central processing unit and then is used for cooling the switching chip and the optical modules, consequently the air cooling heat dissipation capability is weakened and the problem that the switching chip and the optical modules are caused to be overheated is more easily caused.

SUMMARY OF THE PRESENT INVENTION

In view of the above-mentioned disadvantages of the prior art, the purpose of the present invention is to provide a liquid cooling device and an electronic device applying the liquid cooling device, which are used for solving the overheating problem of switching chip and the optical modules, that cannot be effectively solved by the liquid cooling device in the electronic device in prior art.

In order to realize the above-mentioned purpose and other related purposes, the present invention provides a liquid cooling device of an electronic device, which is used for performing heat dissipation to at least one switching chip and at least one optical module in the electronic device, the liquid cooling device comprises: a first cooling plate attached to the switching chip and used for performing heat dissipation to the switching chip; a second cooling plate attached to the optical module and used for performing heat dissipation to the optical module; an air-liquid heat exchanger used for containing cooling liquid and performing cooling to backflow cooling liquid through cooling air; a transmission pipe respectively connected with the first cooling plate, the second cooling plate and the air-liquid heat exchanger and used for sequentially transmitting the cooling liquid flowing out from the air-liquid heat exchanger to the first cooling plate and the second cooling plate, which then flows back to the air-liquid heat exchanger; and a power device used for controlling the cooling liquid in the transmission pipe to be sequentially transmitted to the first cooling plate and the second plate and then flow back.

In one specific embodiment of the present invention, the second cooling plate comprises a second upper cooling plate attached to an upper surface of the optical module; the transmission pipe comprises: a first liquid outlet pipe connected between a liquid outlet of the air-liquid heat exchanger and the first cooling plate and used for transmitting the cooling liquid flowing out from the air-liquid heat exchanger to the first cooling plate; a cooling liquid connecting pipe connected between the first cooling plate and the second upper cooling plate and used for transmitting the cooling liquid flowing out from the first cooling plate to the second upper cooling plate; and a first backflow pipe connected between the second upper cooling plate and a liquid return inlet of the air-liquid heat exchanger and used for allowing the cooling liquid flowing out from the second upper cooling plate to flow back to the air-liquid heat exchanger; and the power device comprises: a first power pump installed on the first liquid outlet pipe and used for controlling the cooling liquid flowing out from the air-liquid heat exchanger to be sequentially transmitted to the first cooling plate and the second upper cooling plate; and a second power pump installed on the first backflow pipe and used for controlling the cooling liquid flowing out from the second upper cooling plate to flow back to the air-liquid heat exchanger.

In one specific embodiment of the present invention, the second cooling plate further comprises a second lower cooling plate attached to a lower surface of the optical module; and the transmission pipe further comprises: a second liquid outlet pipe connected between the liquid outlet of the air-liquid heat exchanger and the second lower cooling plate and used for transmitting the cooling liquid flowing out from the air-liquid heat exchanger to the second lower cooling plate; and a second backflow pipe connected between the second lower cooling plate and the liquid return inlet of the air-liquid heat exchanger and used for allowing the cooling liquid flowing out from the second lower cooling plate to flow back to the air-liquid heat exchanger.

In one specific embodiment of the present invention, the first liquid outlet pipe and the second liquid outlet pipe are connected to the liquid outlet of the air-liquid heat exchanger through a first connecting pipe; the first backflow pipe and the second backflow pipe are connected to the liquid return inlet of the air-liquid heat exchanger through a second connecting pipe; the first power pump is installed on the first connecting pipe; and the second power pump is installed on the second connecting pipe.

In one specific embodiment of the present invention, the liquid cooling device further comprises: a cooling fan arranged at one end of the electronic device and enabling a blown-out air flow to sequentially pass through a central processing unit, the switching chip and the optical module in the electronic device.

In one specific embodiment of the present invention, the air-liquid heat exchanger is installed on a back side opposite to an air outlet side of the cooling fan to enable cooling air to sequentially pass through the air-liquid heat exchanger and the cooling fan and to sequentially pass through the central processing unit, the switching chip and the optical module in the electronic device through the cooling fan.

In one specific embodiment of the present invention, the air-liquid heat exchanger is installed on an air outlet side of the cooling fan to enable the air flow blown out by the cooling fan to pass through the air-liquid heat exchanger, be mixed with the cooling air of the air-liquid heat exchanger and then together sequentially pass through the central processing unit, the switching chip and the optical module in the electronic device.

In one specific embodiment of the present invention, the size of the surface of the first cooling plate is not smaller than half of the size of the surface of the switching chip.

In one specific embodiment of the present invention, the second cooling plate is attached to the surface of the optical module, a length of the second cooling plate is matched with a length of the optical modules arrangement, and a width of the second cooling plate is smaller than the length of a single optical module.

In one specific embodiment of the present invention, the first cooling plate and the second cooling plate are copper pipe embedded cooling plates, bridged cooling plates or vacuum brazed cooling plate.

In order to realize the above-mentioned purpose and other related purposes, the present invention further provides an electronic device, comprising: an electronic device case, at least one switching chip, a plurality of optical modules, a central processing unit, a power supply module and a control mainboard installed in the electronic device case, and the a liquid cooling device as described above, wherein: the plurality of optical modules are arranged at one end in the electronic device case and is arranged in a line along the end; the air-liquid heat exchanger and the cooling fan of the liquid cooling device are sequentially arranged at the other end, opposite to the optical modules, in the electronic device case; the control mainboard is arranged adjacent to the optical modules and the switching chip is arranged on the control mainboard; and the central processing unit is connected with the control mainboard and is arranged between the control mainboard and the cooling fan.

As described above, in the liquid cooling device of the electronic device provided by the present invention, a closed cooling liquid circulation system is formed through the first cooling plate, the second cooling plate, the air-liquid heat exchanger and the transmission pipe, the cooling liquid absorbs heat on the optical modules and the switching chip through the cooling plates, the heat is brought to the air-liquid heat exchanger with larger area through circulation to perform dissipation, the cooled liquid then flows back to the cooling plates to absorb heat on the optical modules and the switching chip, the cooling liquid circulates in such a way and thus the temperature of the switching chip and the optical modules is reduced; and at the same time, the cold air is preheated through the air-liquid heat exchange, sequentially passes through the devices such as the central processing unit through the cooling fan, finally cools the switching chip and the optical modules and then is exhausted, such that the temperature is greatly reduced after the switching chip and the optical modules are dually cooled by the cooling liquid and the cooling air.

DESCRIPTION OF COMPONENT MARK NUMBERS

Figure 1:
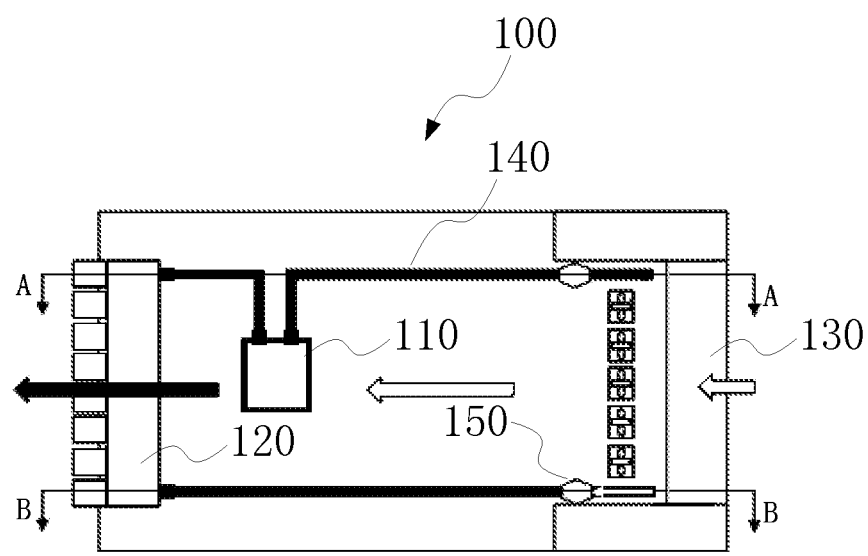
FIG. 1 illustrates a structural schematic diagram of a liquid cooling device provided by the present invention in one specific embodiment.

100 Liquid cooling device
110 First cooling plate
120 Second cooling plate
121 Second upper cooling plate
122 Second lower cooling plate
130 Air-liquid heat exchanger
140 Transmission pipe
141 First liquid outlet pipe
142 Cooling liquid connecting pipe
143 Second liquid outlet pipe
144 First backflow pipe
145 Second backflow pipe
146 First connecting pipe
147 Second connecting pipe
150 Power device
151 First power pump
152 Second power pump
160 Cooling fan
200 Electronic device
210 Electronic device case base
220 Switching chip
230 Optical module
240 Central processing unit
250 Control mainboard
260 First power supply module
270 Second power supply module

DETAILED DESCRIPTION OF THE PREFERRED EMBODIMENTS

The implementation modes of the present invention will be described below through specific examples. One skilled in the art can easily understand other advantages and effects of the present invention according to the content disclosed in the description. The present invention may also be implemented or applied through other different specific implementation modes. Various modifications or variations may be made to all details in the description based on different points of view and applications without departing from the spirit of the present invention. It needs to be stated that the following embodiments and the features in the embodiments may be mutually combined under a situation of no conflict.

It needs to be stated that the drawings provided in the following embodiments are just used for schematically describing the basic concept of the present invention, thus only illustrate components only related to the present invention and are not drawn according to the numbers, shapes and sizes of components during actual implementation, the configuration, number and scale of each component during actual implementation thereof may be freely changed, and the component layout configuration thereof may be more complex.

The purpose of this embodiment is to provide a liquid cooling device and an electronic device applying the liquid cooling device, which are used for solving the problem that the overheat of switching chip and the optical modules cannot be effectively solved by the liquid cooling device in the electronic device in the prior art. The principles and the implementation modes of the liquid cooling device and the electronic device applying the liquid cooling device provided by this embodiment will be described below in detail, such that one skilled in the art can understand the liquid cooling device and the electronic device applying the liquid cooling device without contributing any inventive labor.

Please refer to FIG. 1, which illustrates a structural schematic diagram of a liquid cooling device 100 provided by the present invention in one specific embodiment.

The liquid cooling device 100 is used for performing heat dissipation to at least one switching chip and at least one optical module in the electronic device, and comprises: a first cooling plate 110, a second cooling plate 120, an air-liquid heat exchanger 130, a transmission pipe 140, and a power device 150.

Herein, the electronic device is preferably a switch and may also be electronic devices such as a server.

The first cooling plate 110, the second cooling plate 120, the air-liquid heat exchanger 130, the transmission pipe 140 and the power device 150 form a closed cooling liquid circulation system. The cooling liquid circulation system in this embodiment will be described below in detail.

In this embodiment, the air-liquid heat exchanger 130 is used for containing cooling liquid and performing cooling to backflow cooling liquid through cooling air. In the switch which has a limited space, is high in power density and has a severe requirement on heat dissipation, the advantages of a liquid cooling mechanism are obvious.

The air-liquid heat exchanger 130 contains cooling liquid, the cooling liquid flows to the first cooling plate 110 and the second cooling plate 120 through the transmission pipe 140 and finally flows back to the air-liquid heat exchanger 130, the air-liquid heat exchanger 130 performs cooling and heat dissipation to the backflow cooling liquid through cold air input externally, and the cooling liquid after heat dissipation flows to the first cooling plate 110 and the second cooling plate 120 again, the cooling liquid circulates in such a way and continuously performs liquid cooling heat dissipation to the switching chip and the optical module.

In this embodiment, the transmission pipe 140 is respectively connected with the first cooling plate 110, the second cooling plate 120 and the air-liquid heat exchanger 130 and is used for sequentially transmitting the cooling liquid flowing out from the air-liquid heat exchanger 130 to the first cooling plate 110 and the second cooling plate 120, which then flows back to the air-liquid heat exchanger 130.

In this embodiment, the first cooling plate 110 is attached to the switching chip and used for performing heat dissipation to the switching chip.

Specifically, the size of the surface of the first cooling plate 110 is not smaller than half of the size of the surface of the switching chip. For example, the size of the surface of the first cooling plate 110 is the same as the size of the surface of the switching chip or is slightly smaller than the size of the surface of the switching chip.

A shape of the first cooling plate 110 is preferably the same as a shape of the switching chip.

Herein, the first cooling plate 110 is but not limited to a copper pipe embedded cooling plate, a bridged cooling plate or a vacuum brazed cooling plate. The copper pipe embedded cooling plate, the bridged cooling plate and the vacuum brazed cooling plate are cooling plates which are commonly used for liquid cooling and thus are not described here in detail.

In this embodiment, the second cooling plate 120 is attached to the optical modules and is used for performing heat dissipation to the optical modules.

Specifically, the second cooling plate 120 is attached to a surface of the optical modules. Since there are a plurality of optical modules 2 which are arranged in a row, the second cooling plate 120 is preferably rectangular, a length of the second cooling plate 120 is matched with a length of the optical modules arrangement, and a width of the second cooling plate 120 is smaller than a length of a single optical module, i.e., the surface of the optical module is not fully covered.

Herein, the second cooling plate 120 is but not limited to a copper pipe embedded cooling plate, a bridged cooling plate or a vacuum brazed cooling plate. The copper pipe embedded cooling plate, the bridged cooling plate and the vacuum brazed cooling plate are cooling plates which are commonly used for liquid cooling and thus are not described here in detail.

Figure 2:
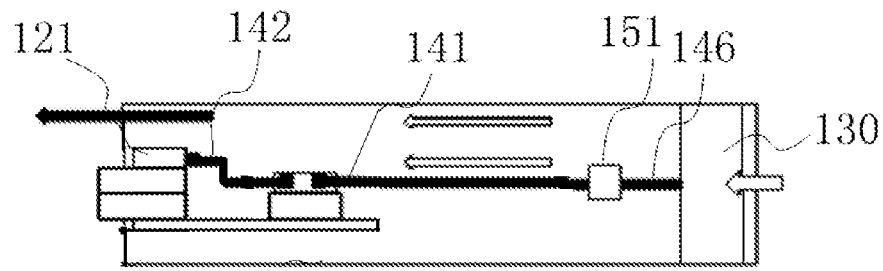
FIG. 2 illustrates a structural schematic diagram of a liquid cooling device provided by the present invention in another specific embodiment.

In one specific embodiment, cooling and heat dissipation are performed to the optical modules through one cooling plate. As illustrated in FIG. 2, the second cooling plate 120 comprises a second upper cooling plate 121 attached to an upper surface of the optical modules.

At this moment, the transmission pipe 140 comprises: a first liquid outlet pipe 141, a cooling liquid connecting pipe 142 and a first backflow pipe 144.

In this embodiment, as illustrated in FIG. 1 and FIG. 2, the first liquid outlet pipe 141 is connected between a liquid outlet of the air-liquid heat exchanger 130 and the first cooling plate 110, and is used for transmitting the cooling liquid flowing out from the air-liquid heat exchanger 130 to the first cooling plate 110.

The cooling liquid connecting pipe 142 is connected between the first cooling plate 110 and the second upper cooling plate 121, and is used for transmitting the cooling liquid flowing out from the first cooling plate 110 to the second upper cooling plate 121.

Figure 4:
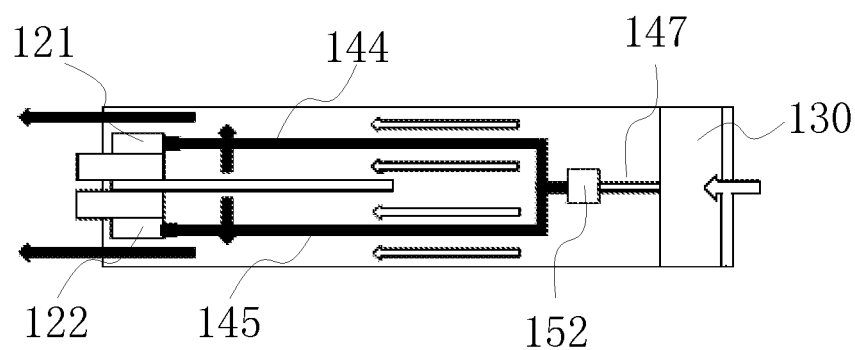
FIG. 4 illustrates a schematic diagram of B-B section in FIG. 1.

As illustrated in FIG. 4, the first backflow pipe 144 is connected between the second upper cooling plate 121 and a liquid return inlet of the air-liquid heat exchanger 130, and is used for allowing the cooling liquid flowing out from the second upper cooling plate 121 to flow back to the air-liquid heat exchanger 130.

In this embodiment, the power device 150 is used for controlling the cooling liquid in the transmission pipe 140 to be sequentially transmitted to the first cooling plate 110, the second cooling plate 120 and then flow back.

Specifically, as illustrated in FIG. 2, in this embodiment, the power device 150 comprises: a first power pump 151 and a second power pump 152.

At this moment, in this embodiment, the first power pump 151 is installed on the first liquid outlet pipe 141 and is used for controlling the cooling liquid flowing out from the air-liquid heat exchanger 130 to be sequentially transmitted to the first cooling plate 110 and the second upper cooling plate 120.

In this embodiment, the second power pump 152 is installed on the first backflow pipe 144 and is used for controlling the cooling liquid flowing out from the second upper cooling plate 121 to flow back to the air-liquid heat exchanger 130.

Figure 3:
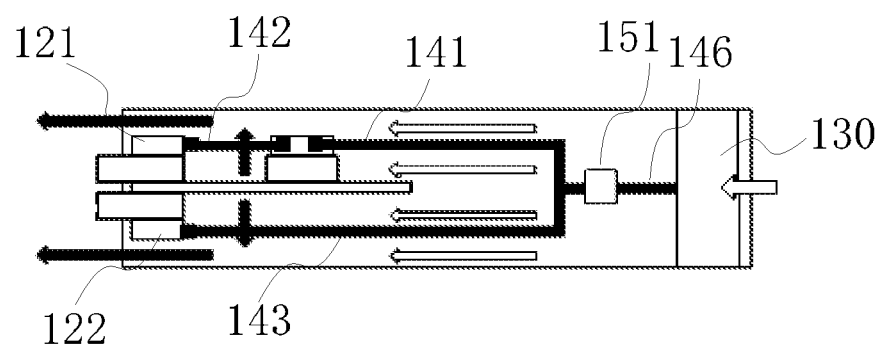
FIG. 3 illustrates a schematic diagram of A-A section in FIG. 1.

Besides, in another embodiment, as illustrated in FIG. 3 and FIG. 4, the second cooling plate 120 further comprises a second lower cooling plate 122 attached to a lower surface of the optical modules, i.e., the second cooling plate 120 comprises the second upper cooling plate 121 and the second lower cooling plate 122 respectively attached to upper and lower surfaces of the optical modules. At this moment, cooling and heat dissipation are performed to the optical modules through two cooling plates, i.e., the second upper cooling plate 121 and the second lower cooling plate 122.

At this moment, as illustrated in FIG. 3 and FIG. 4, in addition to the first liquid outlet pipe 141, the cooling liquid connecting pipe 142 and the first backflow pipe 144, the transmission pipe 140 further comprises a second liquid outlet pipe 143 and a second backflow pipe 145.

The second liquid outlet pipe 143 is connected between the liquid outlet of the air-liquid heat exchanger 130 and the second lower cooling plate 122 and is used for transmitting the cooling liquid flowing out from the air-liquid heat exchanger 130 to the second lower cooling plate 122.

The second backflow pipe 145 is connected between the second lower cooling plate 122 and the liquid return inlet of the air-liquid heat exchanger 130 and is used for allowing the cooling liquid flowing out from the second lower cooling plate 122 to flow back to the air-liquid heat exchanger 130.

Herein, the first liquid outlet pipe 141 and the second liquid outlet pipe 143 are connected to the liquid outlet of the air-liquid heat exchanger 130 through a first connecting pipe 146; and the first backflow pipe 144 and the second backflow pipe 145 are connected to the liquid return inlet of the air-liquid heat exchanger 130 through a second connecting pipe 147.

At this moment, the first power pump 151 is installed on the first connecting pipe 146; and the second power pump 152 is installed on the second connecting pipe 147.

In this embodiment, the first power pump 151 is installed on the first connecting pipe 146 and is used for controlling the cooling liquid flowing out from the air-liquid heat exchanger 130 to be sequentially transmitted to the first cooling plate 110 and the second upper cooling plate 120.

In this embodiment, the second power pump 152 is installed on the second connecting pipe 147 and is used for controlling the cooling liquid flowing out from the second upper cooling plate 121 and the second lower cooling plate 122 to flow back to the air-liquid heat exchanger 130.

In this embodiment, the liquid cooling device 100 simultaneously supports a front-in rear-out and rear-in front-out two-air-direction requirement, and is applicable to a switch which supports the front-in rear-out and rear-in front-out two-air-direction requirement. In other words, the liquid cooling device 100 can support two air flow directions as follows:

Air flow direction 1: from front to rear, at this moment the cooling air firstly passes through the optical modules, the switching chip and the central processing unit and then is supplied to the air-liquid heat exchanger 130, and the cooling effect is better.

Air flow direction 2: from rear to front, at this moment the cooling air supplied to the air-liquid heat exchanger 130 firstly is preheated by components of the central processing unit and then passes through the optical modules and the switching chip, and the cooling effect is relatively poorer.

In one specific embodiment, the liquid cooling device 100 further comprises a cooling fan 160 arranged at one end of the electronic device and enabling a blown-out air flow to sequentially pass through the central processing unit, the switching chip and the optical modules in the electronic device.

A position relation between the cooling fan 160 and the air-liquid heat exchanger 130 includes the following two kinds:

1) In this embodiment, specifically, the air-liquid heat exchanger 130 is installed on a back side opposite to an air outlet side of the cooling fan 160 to enable cooling air to sequentially pass through the air-liquid heat exchanger 130 and the cooling fan 160 and to sequentially pass through the central processing unit, the switching chip and the optical module in the electronic device through the cooling fan 160.

The cold air is preheated by the air-liquid heat exchanger 130, enters the electronic device through the cooling fan 160, sequentially passes through the devices such as the central processing unit through the cooling fan 160, finally cools the switching chip and the optical modules and then is exhausted, such that the temperature is greatly reduced after the switching chip and the optical modules are dually cooled by the cooling liquid and the cooling air.

2) The air-liquid heat exchanger 130 is installed on an air outlet side of the cooling fan 160 to enable the air flow blown out by the cooling fan 160 to pass through the air-liquid heat exchanger 130, be mixed with the cooling air of the air-liquid heat exchanger 130 and then together sequentially pass through the central processing unit, the switching chip and the optical module in the electronic device.

Figure 5:
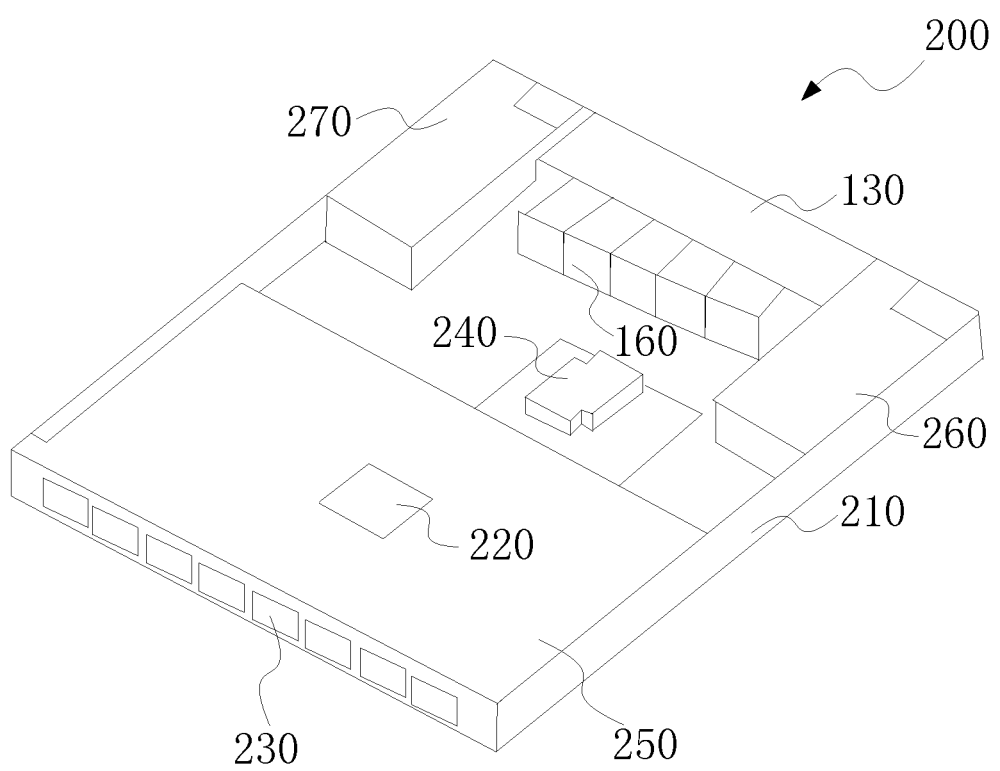
FIG. 5 illustrates a structural schematic diagram of an electronic device provided by the present invention.

Besides, as illustrated in FIG. 5, this embodiment further provides an electronic device 200, comprising: an electronic device case, at least one switching chip 220, a plurality of optical modules 230, a central processing unit 240, a power supply module and a control mainboard 250 installed in the electronic device case (specifically an electronic device case base 210), and the above-mentioned liquid cooling device 100.

Herein, the plurality of optical modules 230 are arranged at one end in the electronic device case and is arranged in a line along the end.

The air-liquid heat exchanger 130 and the cooling fan 160 of the liquid cooling device 100 are sequentially arranged at the other end, opposite to the optical modules 230, in the electronic device case; the control mainboard 250 is arranged adjacent to the optical modules and the switching chip 220 is arranged on the control mainboard 250; and the central processing unit 240 is connected with the control mainboard 250 and is arranged between the control mainboard 250 and the cooling fan 160.

The power supply module comprises a first power supply module 160 and a second power supply module 170 respectively located on two sides of the cooling fan 160.

Herein, a number of the cooling fans 160 is preferably 1-5. The liquid cooling device 100 has already been described above in detail and thus is not repetitively described here.

To sum up, as described above, in the liquid cooling device provided by the present invention, a closed cooling liquid circulation system is formed through the first cooling plate, the second cooling plate, the air-liquid heat exchanger and the transmission pipe, the cooling liquid absorbs heat on the optical modules and the switching chip through the cooling plates, the heat is brought to the air-liquid heat exchanger with larger area through circulation to perform dissipation, the cooled liquid then flows back to the cooling plates to absorb heat on the optical modules and the switching chip, the cooling liquid circulates in such a way and thus the temperature of the switching chip and the optical modules is reduced; and at the same time, the cold air is preheated through the air-liquid heat exchange, sequentially passes through the devices such as the central processing unit through the cooling fan, finally cools the switching chip and the optical modules and then is exhausted, such that the temperature is greatly reduced after the switching chip and the optical modules are dually cooled by the cooling liquid and the cooling air. Therefore, the present invention effectively overcomes various disadvantages in the prior art and thus has a great industrial utilization value.

The above-mentioned embodiments are just used for exemplarily describing the principle and the effect of the present invention instead of limiting the present invention. One skilled in the art may make modifications or variations to the above-mentioned embodiments without departing from the spirit and scope of the present invention. Therefore, all equivalent modifications or variations made by one skilled in the art without departing from the spirit and technical concept disclosed by the present invention shall be also covered by the claims of the present invention.

What is claimed is:

1. An electronic device comprising: an electronic device case, at least one switching chip, a plurality of optical modules, a central processing unit, a power supply module and a control mainboard installed in the electronic device case; a liquid cooling device for performing heat dissipation to the at least one switching chip and the at least one optical module in the electronic device: the liquid cooling device comprises: a first cooling plate attached to the switching chip and used for performing heat dissipation to the switching chip; a second cooling plate attached to the optical module and used for performing heat dissipation to the optical module; an air-liquid heat exchanger used for containing cooling liquid and performing cooling to backflow cooling liquid through cooling air; a transmission pipe respectively connected with the first cooling plate, the second cooling plate and the air-liquid heat exchanger and used for sequentially transmitting the cooling liquid flowing out from the air-liquid heat exchanger to the first cooling plate and the second cooling plate, which then flows back to the air-liquid heat exchanger; and a power device used for controlling the cooling liquid in the transmission nine to be sequentially transmitted to the first cooling plate and the second plate and then flow back, wherein: the plurality of optical modules are arranged at one end in the electronic device case and is arranged in a line along the end; the air-liquid heat exchanger and the cooling fan of the liquid cooling device are sequentially arranged at the other end, opposite to the optical modules, in the electronic device case; the control mainboard is arranged adjacent to the optical modules and the switching chip is arranged on the control mainboard; and the central processing unit is connected with the control mainboard and is arranged between the control mainboard and the cooling fan.

* * * * *